US007199575B2

(12) United States Patent
Chen et al.

(10) Patent No.: US 7,199,575 B2
(45) Date of Patent: Apr. 3, 2007

(54) TFT-LCD SOURCE DRIVER WITH BUILT-IN TEST CIRCUIT AND METHOD FOR TESTING THE SAME

(75) Inventors: Lin-Chien Chen, Hsin Chu (TW); Dar-Chang Juang, Hsin Chu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 11/114,015

(22) Filed: Apr. 26, 2005

(65) Prior Publication Data

US 2006/0022930 A1 Feb. 2, 2006

(30) Foreign Application Priority Data

Jul. 30, 2004 (TW) .............................. 93123009 A

(51) Int. Cl.
*G01R 31/00* (2006.01)
*G09G 3/36* (2006.01)

(52) U.S. Cl. .................................................. 324/158.1

(58) Field of Classification Search ................ 324/770, 324/765; 345/98–100, 204, 93
See application file for complete search history.

(56) References Cited

U.S. PATENT DOCUMENTS

| | | | | |
|---|---|---|---|---|
| 6,191,770 | B1 * | 2/2001 | Kim | 345/100 |
| 6,909,304 | B2 * | 6/2005 | Takafuji et al. | 324/770 |
| 6,946,307 | B2 * | 9/2005 | Shih | 438/17 |
| 6,972,755 | B2 * | 12/2005 | Plangger | 345/204 |
| 2005/0162374 | A1 * | 7/2005 | Kim et al. | 345/100 |

* cited by examiner

*Primary Examiner*—Vinh P. Nguyen

(57) ABSTRACT

A TFT-LCD source driver with a built-in test circuit includes N driving units and P test units. Each driving unit receives digital data and generates an analog output signal according to the digital data. Each test unit receives the analog output signals, selects one of them as a test signal according to a select signal, and compares the test signal with a high reference voltage and a low reference voltage to output an indication signal. The indication signal is set to indicate an abnormal state as the voltage of the test signal is higher than the high reference voltage or lower than the low reference voltage.

9 Claims, 9 Drawing Sheets

TFT-LCD SOURCE DRIVER WITH BUILT-IN TEST CIRCUIT AND METHOD FOR TESTING THE SAME

This application claims the benefit of the filing date of Taiwan Application Ser. No. 093111174, filed on Apr. 22, 2004, the content of which is incorporated herein by reference.

BACKGROUND OF THE INVENTION (a) Field of the Invention

The invention relates to a source driver of a thin film transistor liquid crystal display (TFT-LCD) and, more particularly, to a TFT-LCD source driver having a built-in test circuit.

(b) Description of the Related Art

Nowadays, the mass production test for an LCD source driver is performed by a tester. FIG. 1 shows a schematic diagram illustrating a conventional source driver 10 consisting of N driving units 11. Each driving unit 11 includes a level shifter 111, a digital to analog converter (DAC) 112, and a unity gain buffer 113. Digital data received by each driving unit 11 is modified by the level shifter 111 and then transmitted to the DAC 112. The DAC 112 outputs analog output signals via the unity gain buffer 113; hence, a typical source driver may generate output signals S(1)–S(N), as shown in FIG. 1. FIG.2 shows a schematic diagram illustrating a conventional tester 20 for testing the source driver 10. A typical tester 20 includes P test units 21, and each unit consists of a multiplexer 211 and an analog to digital converter (ADC) 212. Each multiplexer 211 receives M analog output signals S(1)–S(M). Note that the numbers of the P test units 21, M analog output signals received by the multiplexer 211, and N driving units 11 must satisfy the condition $P \times M \geqq N$.

In this embodiment, the tester 20 receives N analog output signals S(1)–S(N) output from the source driver 10, and each multiplexer 211 in the P test units 21 receives M analog output signals S(1)–S(M). The multiplexer 211 selects one of the analog output signals S(1)–S(M) as a test signal through the control of a select signal, and then the test signal is transmitted to the ADC 212 to be transformed into digital data. Finally, the tester 20 may judge whether the output voltage of the source driver 10 conforms to a specification according to all digital data transformed from the ADC 212 to completely examine the characteristic of the source driver 10.

However, the number of output pins in a typical source driver often ranges from 300 to 500; in other words, the number N of the drive units 11 equals approximately 300–500. To satisfy the condition $P \times M \geqq N$ for the tester design, the number M of input pins of one test unit 21 (equal to the number M of the analog output signals received by one multiplexer 211) and the number P of the test units 21 must be increased as the number N of the drive units 11 is increased. Under the circumstance, the increase in layout areas for the total input pins of the tester 20 and the number of the test units may result in a considerable occupied space of the tester. Additionally, in that case, the ADC 212 is required to have a high resolution to meet the measure requirement of a high accuracy, so that the tester 20 incorporating the ADC 212 is expensive. For these reasons, the cost of testing an LCD source driver is high.

Hence, a solution to reduce the occupied space of a tester and the testing cost of an LCD source driver and to provide a highly accuracy measurement is urgently needed.

BRIEF SUMMARY OF THE INVENTION

Hence, an object of the invention is to provide a TFT-LCD source driver with a built-in circuit that allows for decreasing layout areas for total input pins of a tester, the number of test units, and thus the occupied space of a tester.

Another object of the invention is to provide a TFT-LCD source driver with a built-in circuit that allows for providing a highly accuracy measurement and reducing the cost of the tester.

According to the invention, a TFT-LCD source driver with a built-in test circuit includes N driving units and P test units. Each driving unit receives digital data and generates an analog output signal according to the digital data. Each test unit receives the analog output signals and selects one of them as a test signal according to a select signal.

When the voltage of the test signal is higher than a high reference voltage or is lower than a low reference voltage, the test unit outputs an indication signal indicating an abnormal state to the tester.

The tester may include a multiplexer, a first comparator, a second comparator, and a judging unit. The multiplexer receives M analog output signals and selects one of them as a test signal according to the select signal. The first comparator receives the test signal and a high reference voltage signal and compares their voltage values with each other to generate a first comparison signal to the judging unit. The second comparator receives the test signal and a low reference voltage signal and compares their voltage values with each other to generate a second comparison signal to the judging unit. The judging unit receives the first and second comparison signals to generate the indication signal.

The indication signal indicates an abnormal state as the voltage of the test signal is higher than the high reference voltage or lower than the low reference voltage. The indication signal indicates a normal state as the voltage of the test signal is lower than the high reference voltage and higher than the low reference voltage. Hence, the tester may recognize whether the driving unit corresponding to that selected test signal conforms a specification after receiving the output of the judging units.

Through the design of the invention, since the test unit is incorporated inside the source driver, the M input pins of the test unit may be disposed in a manner like printed circuit to reduce the layout areas compared to conventional designs. In other words, because the M input pins of the test unit may disposed in a manner like printed circuit, its number can be considerable increased with merely a little increase in the layout areas, and the number of the P test units also can be decreased.

Further, whether the driving unit corresponding to a test signal conforms to a specification is easy to be recognized only by the first comparator, the second comparator and the judging unit altogether, and thus an expensive tester used in the conventional design is no longer needed to considerably reduce cost.

DETAILED DESCRIPTION OF THE INVENTION

Figure 1:
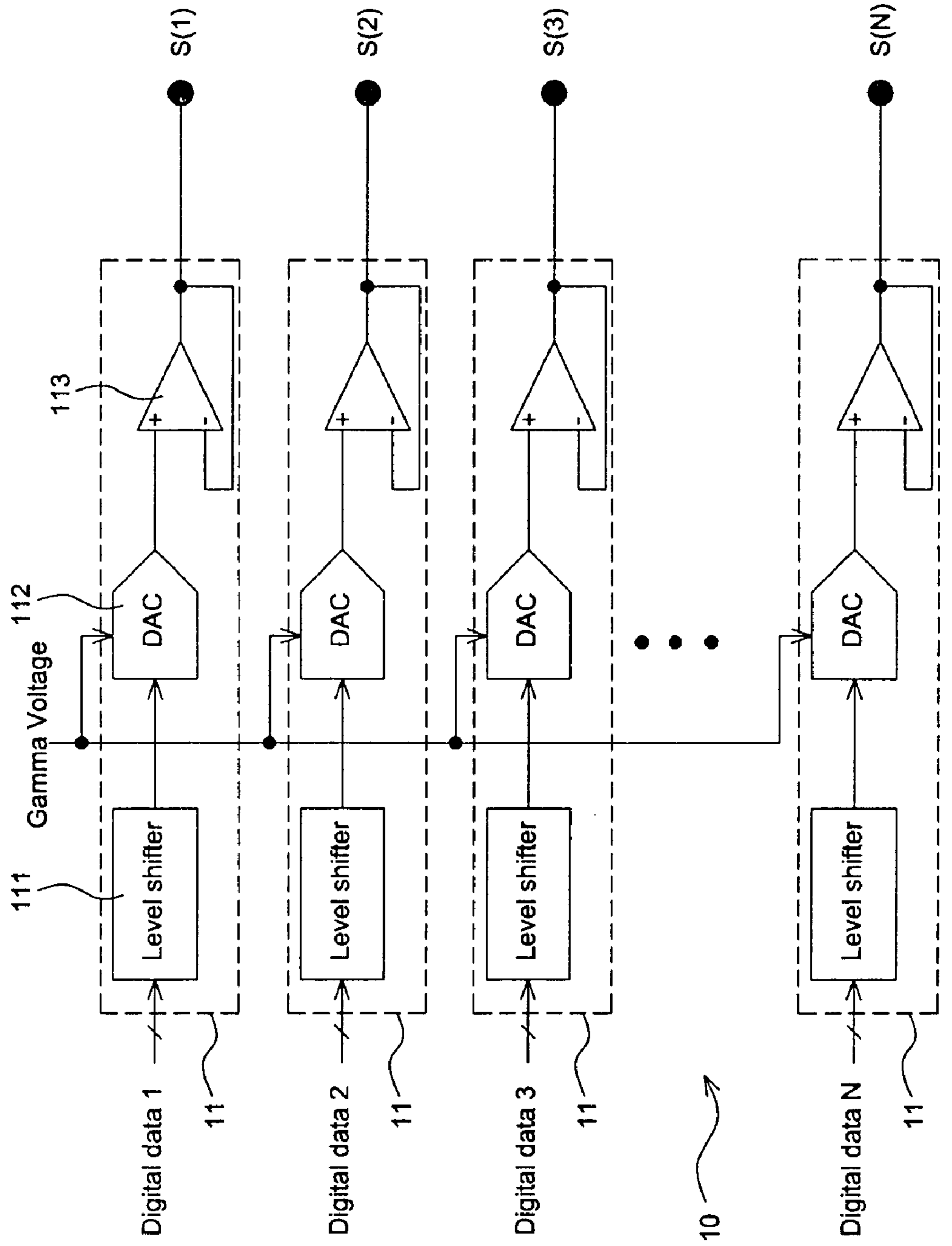
FIG. 1 (Prior Art)
FIG. 1 shows a schematic diagram illustrating a conventional source driver.
Figure 2:
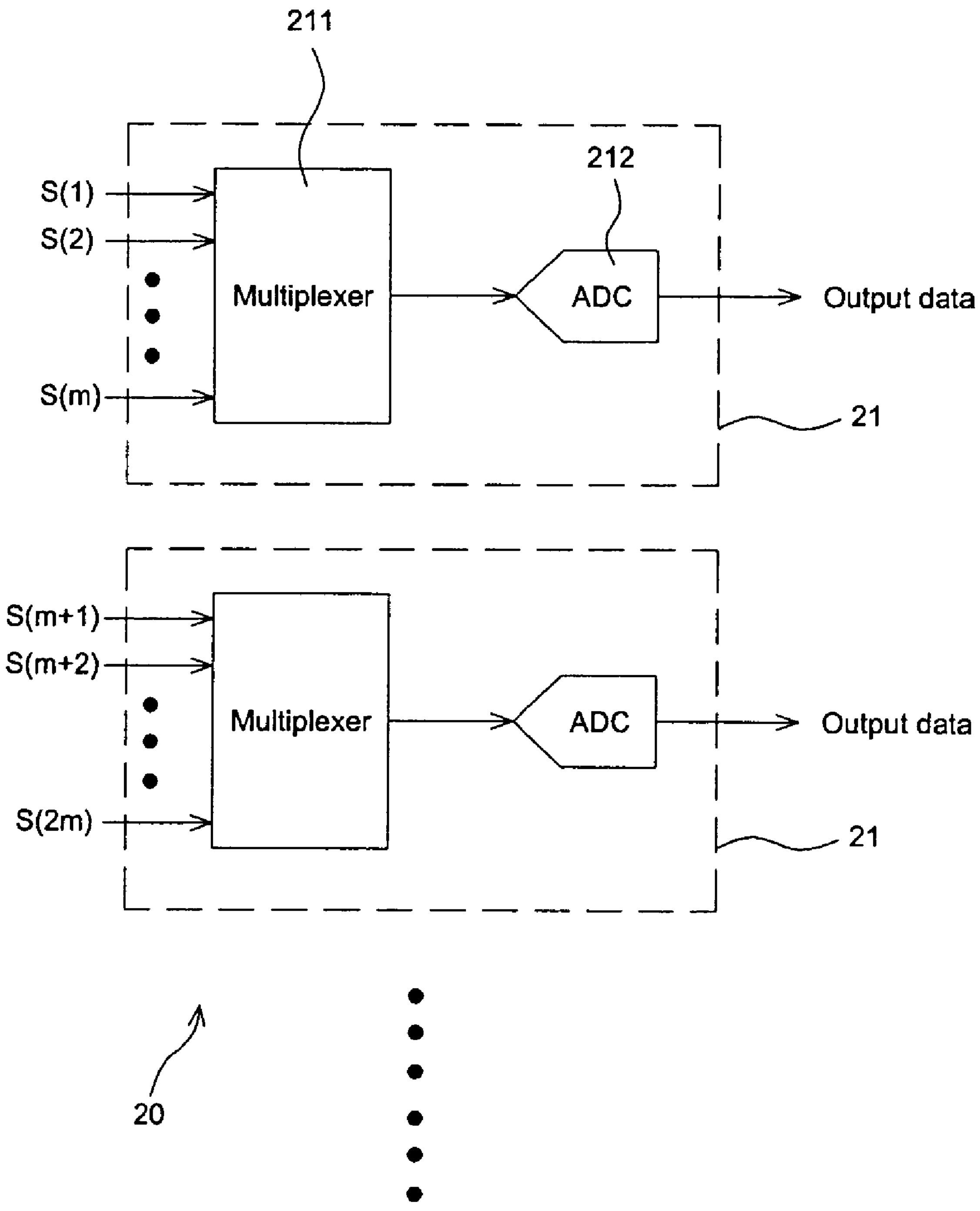
FIG. 2 (Prior Art)
FIG. 2 shows a schematic diagram illustrating a conventional tester.
Figure 3A:
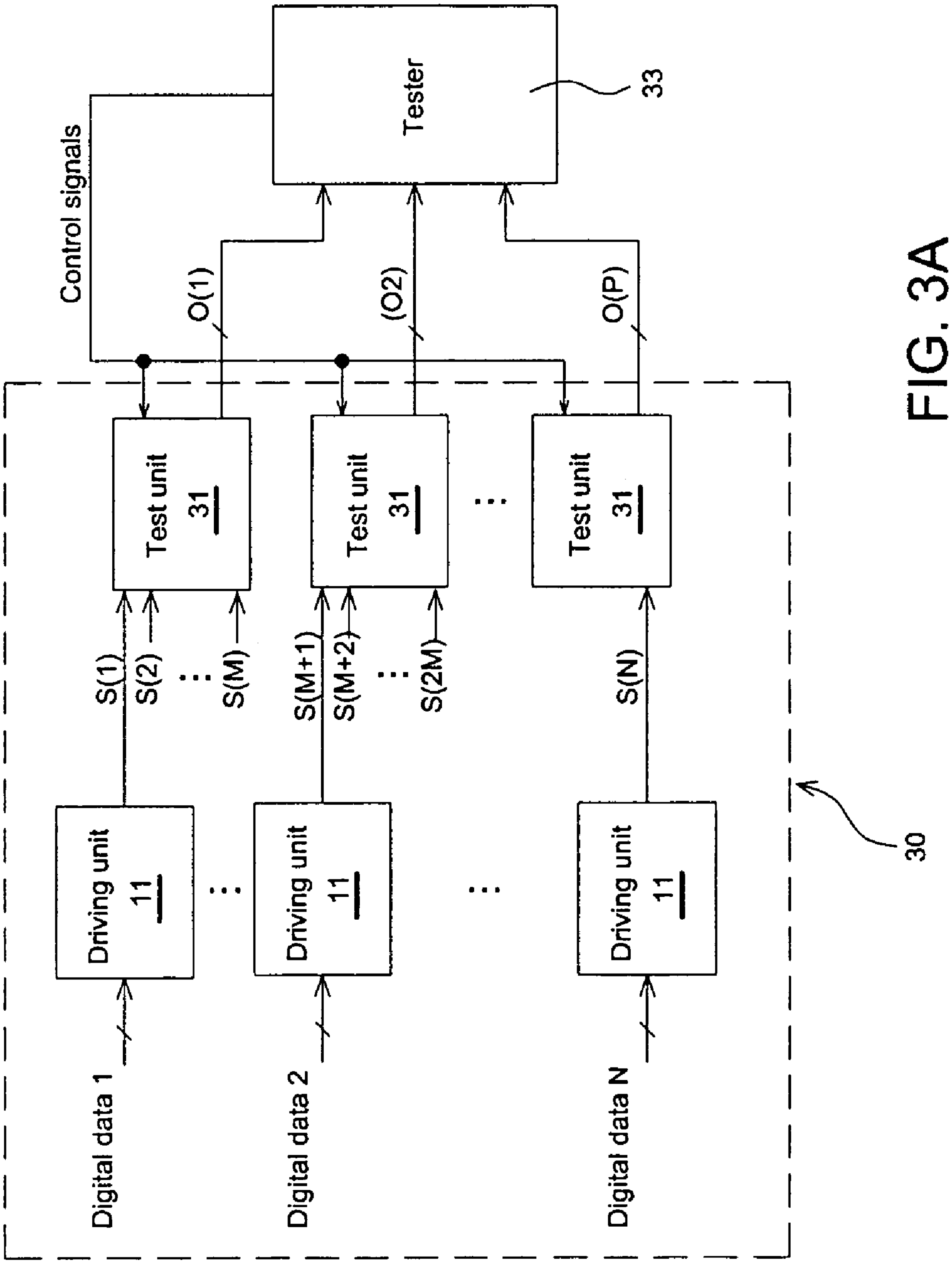
FIG. 3A shows a schematic diagram illustrating a testing architecture for a TFT-LCD source driver with built-in test circuit according to the invention.

FIG. 3A shows a schematic diagram illustrating a testing architecture for a TFT-LCD source driver with built-in test circuit. The testing architecture includes N driving units 11, P test units 31, and a tester 33. Each of the N driving units 11 receives digital data and then outputs an analog output signals, one of the signals S(1)–S(N) as in FIG. 3A, according to the digital data. Each test unit 31 receives M output signals from the driving units 11, select one of the M output signals as a test signal through the control of a select signal, and meanwhile generate an indication signal. When the voltage of the test signal is higher than a high reference voltage Vmax(G) or is lower than a low reference voltage Vmin(G), the indication signal indicates an abnormal state. Finally, the tester 33 only needs to output a test signal according to the status of each indication signal to show that whether the driving unit corresponding to that test signal conforms to a specification. The control signals for the tester 33 includes the select signal, the high reference voltage Vmax(G), the low reference voltage Vmin(G), and a stage control signal. The operation and configuration of the driving unit 11 is the same as that shown in FIG. 1, thus not explaining in detail.

Figure 3B:
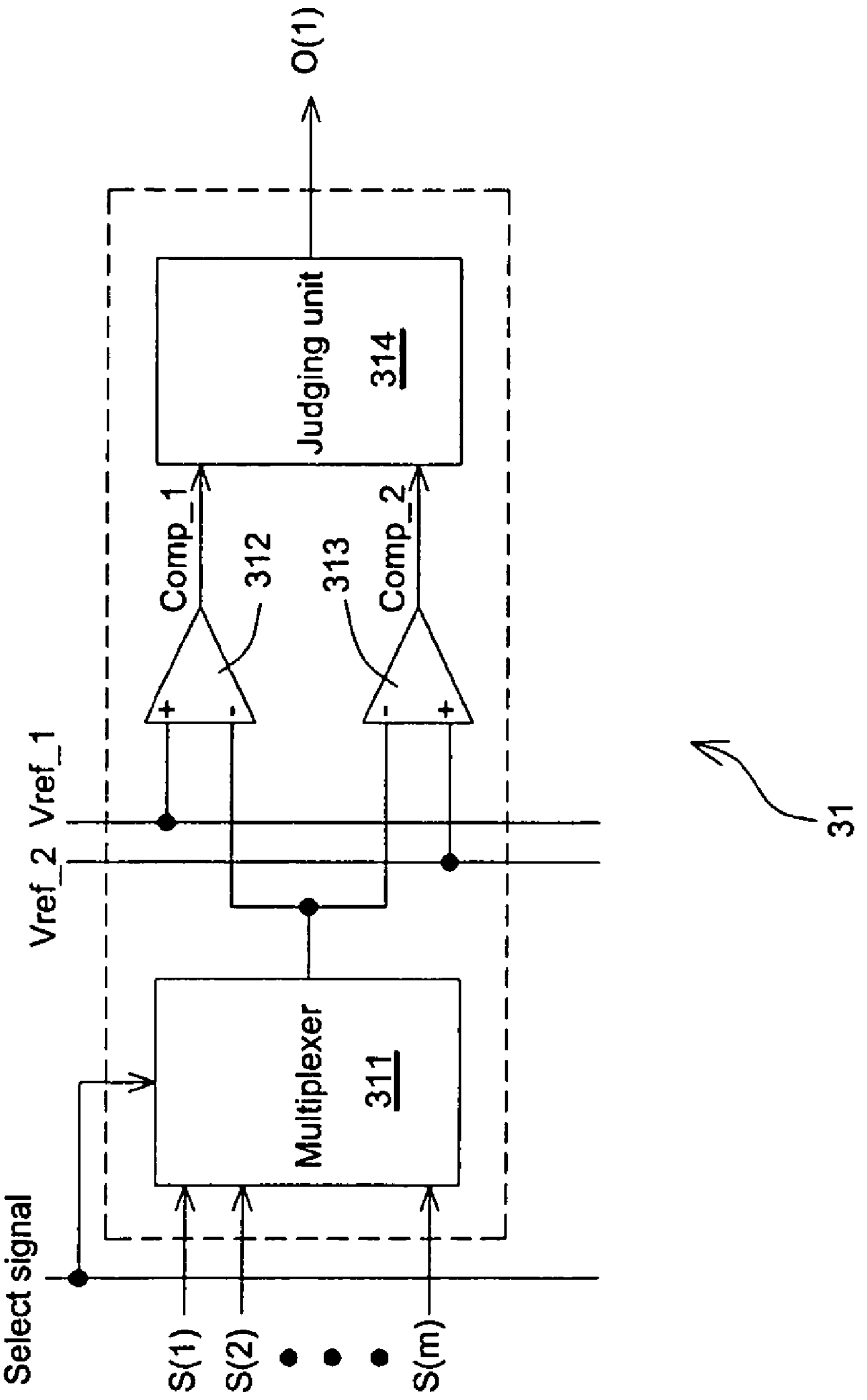
FIG. 3B shows a schematic diagram illustrating a test unit of the TFT-LCD source driver according to an embodiment of the invention.

FIG. 3B shows a schematic diagram illustrating a test unit of the TFT-LCD source driver according to an embodiment of the invention. The test unit 31 includes a multiplexer 311, a first comparator, a second comparator 313, and a judging unit 314. The multiplexer 311 receives M output signals S(1)–S(M) from the driving units 11 and selects one of the M output signals as a test signal. After receiving the test signal and a first reference voltage signal Vref_1, the first comparator 312 compares the test signal with the first reference voltage signal Vref_1 and then outputs a first comparison signal Comp_1. The voltage of the first reference voltage signal Vref_1 is defined as the high reference voltage Vmax(G). The second comparator 313 receives the test signal and a second reference voltage signal Vref_2, comparing them with each other, and then outputs a second comparison signal Comp_2. The voltage of the second reference voltage signal Vref_2 is defined as the low reference voltage Vmin(G). The judging unit 314 receives the first comparison signal Comp_1 and the second comparison signal Comp_2 and outputs an indication signal according to the status of them. More specifically, if the voltage of the test signal is higher than the high reference voltage Vmax(G), the first comparison signal Comp_1 is "H"; if not, the first comparison signal Comp_1 is "L". Further, if the voltage of the test signal is lower than the low reference voltage Vmin(G), the second comparison signal Comp_2 is "L"; if not, the second comparison signal Comp_2 is "H". Therefore, the judging unit 314 may transmit an indication signal that indicates an abnormal state to the tester 33 only by detecting the "H" value of the first comparison signal Comp_1 or "L" value of the second comparison signal Comp_2. After receiving the indication signal from the judging unit 314, the tester 33 may judge whether the voltage of the test signal is beyond the range between Vmax(G) and Vmin(G) to recognize that whether the test signal conforms to a specification. That is, the indication signal indicative of an abnormal state means that the driving unit corresponding to that selected test signal is defective.

Figure 4:
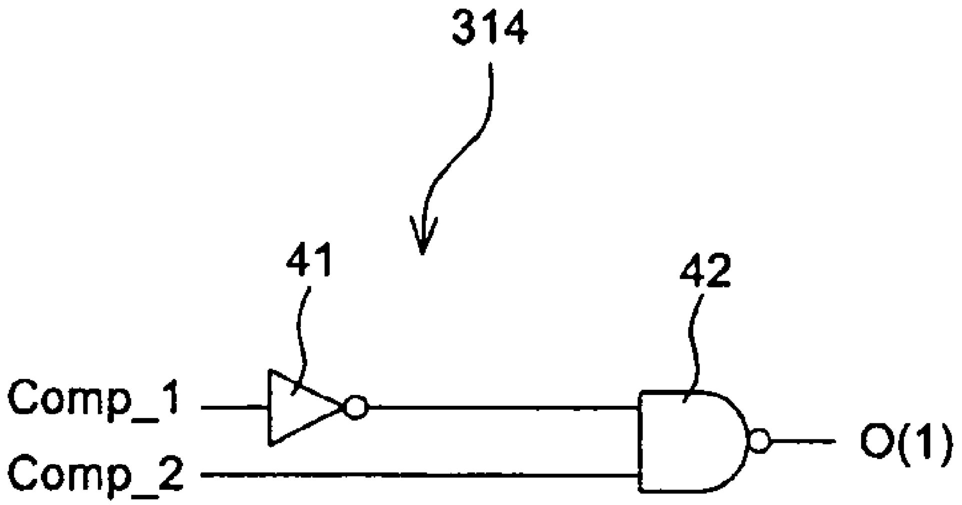
FIG. 4 illustrates a judging unit according to an embodiment of the invention.

FIG. 4 illustrates a judging unit according to an embodiment of the invention. The judging unit 314, which includes a NOT gate 41 and a NAND gate 42, receives the first comparison signal Comp_1 and the second comparison signal Comp_2 to generate the indication signal. The output terminal of the NOT gate 41 is connected to an input terminal of the NAND gate 42. The first comparison signal Comp_1 is transmitted to the judging unit 314 via the input terminal of the NOT gate 41, and the second comparison signal Comp_2 is transmitted to the judging unit 314 via the other input terminal of the NAND gate 42. Hence, when the first comparison signal Comp_1 is "L" and the second comparison signal Comp_2 is "H", the output of the NAND gate 42 is "H". On the other hand, when the first comparison signal Comp_1 is "H" or the second comparison signal Comp_2 is "L", the output of the NAND gate 42 is "L", meaning an abnormal state.

Figure 5:
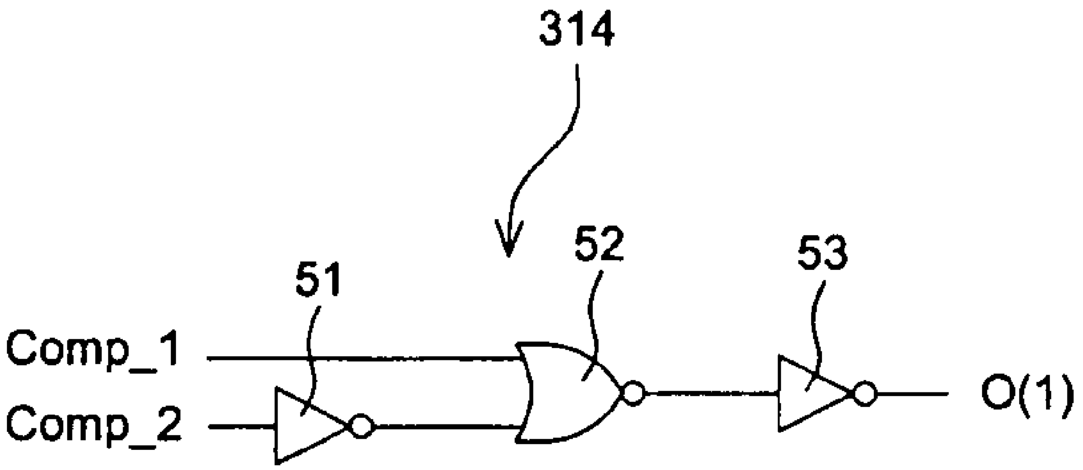
FIG. 5 illustrates a judging unit according to another embodiment of the invention.

FIG. 5 illustrates a judging unit according to another embodiment of the invention. The judging unit 314 includes a first NOT gate 51, a NOR gate 52, and a second NOT gate 53. An input terminal of the NOR gate 52 is connected to the output terminal of the first NOT gate 51, and the output terminal of the NOR gate 52 is connected to the input terminal of the second NOT gate 53. The first comparison signal Comp_1 is transmitted to the judging unit 314 via the other input terminal of the NOR gate 52, and the second comparison signal Comp_2 is transmitted to the judging unit 314 via the input terminal of the NOT gate 51. Hence, when the first comparison signal Comp_1 is "H" and the second comparison signal Comp_2 is "L", the indication signal output from the judging unit 314 is "L", meaning an abnormal state.

Note that the numbers of the P test units 31, M analog output signals received by the multiplexer 311, and N driving units 11 must satisfy the condition $P \times M \geqq N$.

In this embodiment, whether the driving unit corresponding to a test signal conforms to a specification is easy to be recognized only by the first comparator 312, the second comparator 313 and the judging unit 314 altogether, and thus an expensive tester used in conventional design is no longer needed to considerably reduce cost.

Further, according to the invention, since the test unit is incorporated inside the source driver, the M input pins of the test unit may be disposed in a manner like printed circuit to reduce the layout areas compared to conventional designs. In other words, because the M input pins of the test unit may be disposed in a manner like printed circuit, its number can be considerable increased with merely a little increase in the layout areas, and the number of the P test units also can be decreased.

Figure 6:
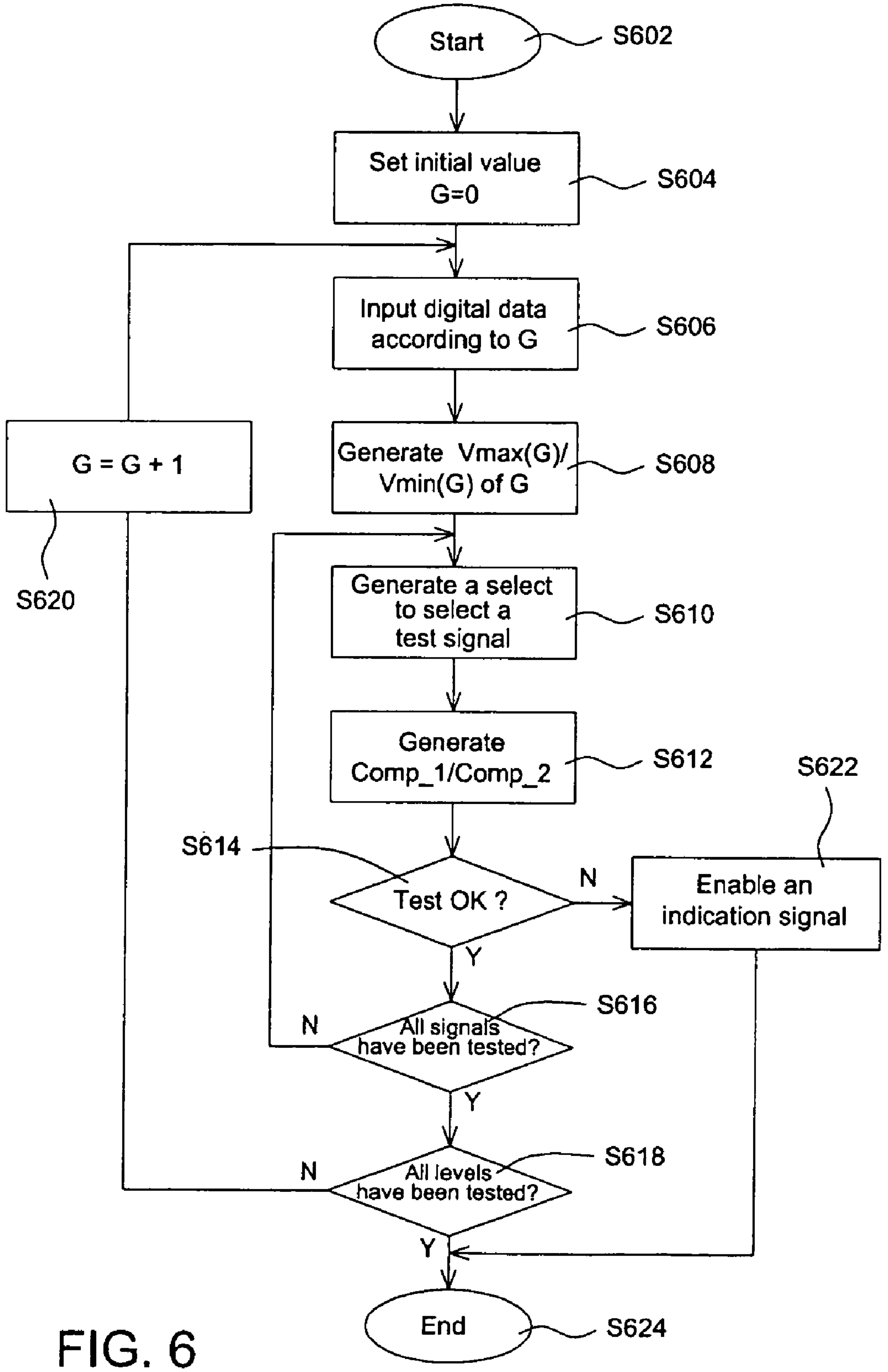
FIG. 6 shows a flow diagram illustrating a test method for the TFT-LCD source driver with a built-in test circuit.

FIG. 6 shows a flow diagram illustrating a test method for a TFT-LCD source driver with a built-in test circuit. The source driver 30 receives N digital data and generates N output signals S(1)–S(N). The test method includes the following steps:

Step S602: start.

Step S604: set an initial gray-level value G=0. The resolution of the gray-level value is determined by the bit number of the digital data. For instance, the gray-level value equals 0–1023 for 10-bit digital data.

Step S606: input digital data according to the gray-level value G to all driving units 11.

Step S608: Generate a high reference voltage Vmax(G) and a low reference voltage Vmin(G) corresponding to the gray-level value G. The reference voltages may be produced by the tester 33.

Step S610: generate a select signal for selecting one analog output signal as a test signal. The select signal is needed because each test unit may examine only one of the M analog output signals at a time. The select signal may be produced by the tester 33

Step S612: compare the voltage of the test signal with the reference voltages Vmax(G) and Vmin(G).

Step S614: if the voltage of the test signal is higher than the high reference voltage Vmax(G) or lower than the low reference voltage Vmin(G), meaning that the driving unit corresponding to that test signal is defective, skip to step S622. If the voltage of the test signal is lower than the high reference voltage Vmax(G) and higher than a low reference voltage Vmin(G), meaning that the driving unit corresponding to that test signal conforms to a specification, skips to step S616.

Step S616: detect whether all the analog input signals have been tested. If no, go back to step S610.

Step S618: detect whether all the gray-level values have been tested. If no, skip to step S620. If yes, skip to step S624.

Step S620: adjust the gray-level value G and go back to step S606. For example, the gray-level value G may be added with one unit at a time.

Step S622: enable an indication signal indicating the defective state of the driving unit.

Step S624: end.

Figure 7:
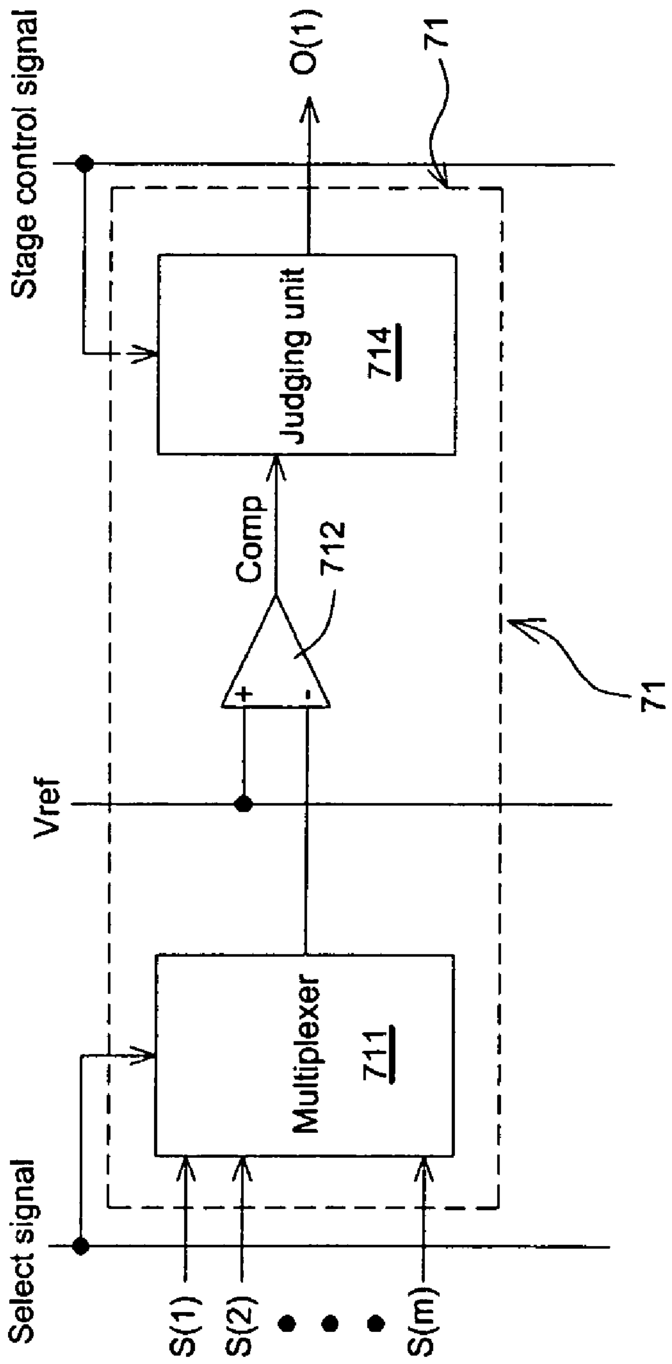
FIG. 7 illustrates a test unit of the TFT-LCD source driver according to another embodiment of the invention.

FIG. 7 illustrates a test unit 71 of a TFT-LCD source driver according to another embodiment of the invention. The test unit 71 in FIG. 7 and the test unit 31 in FIG. 3A are almost the same as having the multiplexer, comparator and judging unit, except that the test unit 71 has only one comparator 712 and a two-stage procedure for comparing the signals.

In the first stage, the comparator 712 receives a test signal from the multiplexer 711 and a first reference voltage signal Vref whose voltage is defined as the high reference voltage Vmax(G), comparing their voltage values with each other, and then outputs a comparison signal Comp to the judging unit 714. If the voltage of the test signal is not higher than the high reference voltage Vmax(G), a second stage for comparing the signals is required. In the second stage, the voltage of the reference voltage signal is defined as the low reference voltage Vmin(G), and the voltage of the test signal is compared with the low reference voltage Vmin(G) to transmit a comparison result to the judging unit 714 through the comparison signal Comp. Further, the judging unit 714 may recognize the present stage as the first or the second stage according to a stage control signal, which may be provided by the tester 33. Hence, according to this embodiment, without regard for the disadvantage of the two-stage procedure, it is beneficial to reduce the occupied space of the source driver because only one comparator 712 is needed.

Figure 8A:
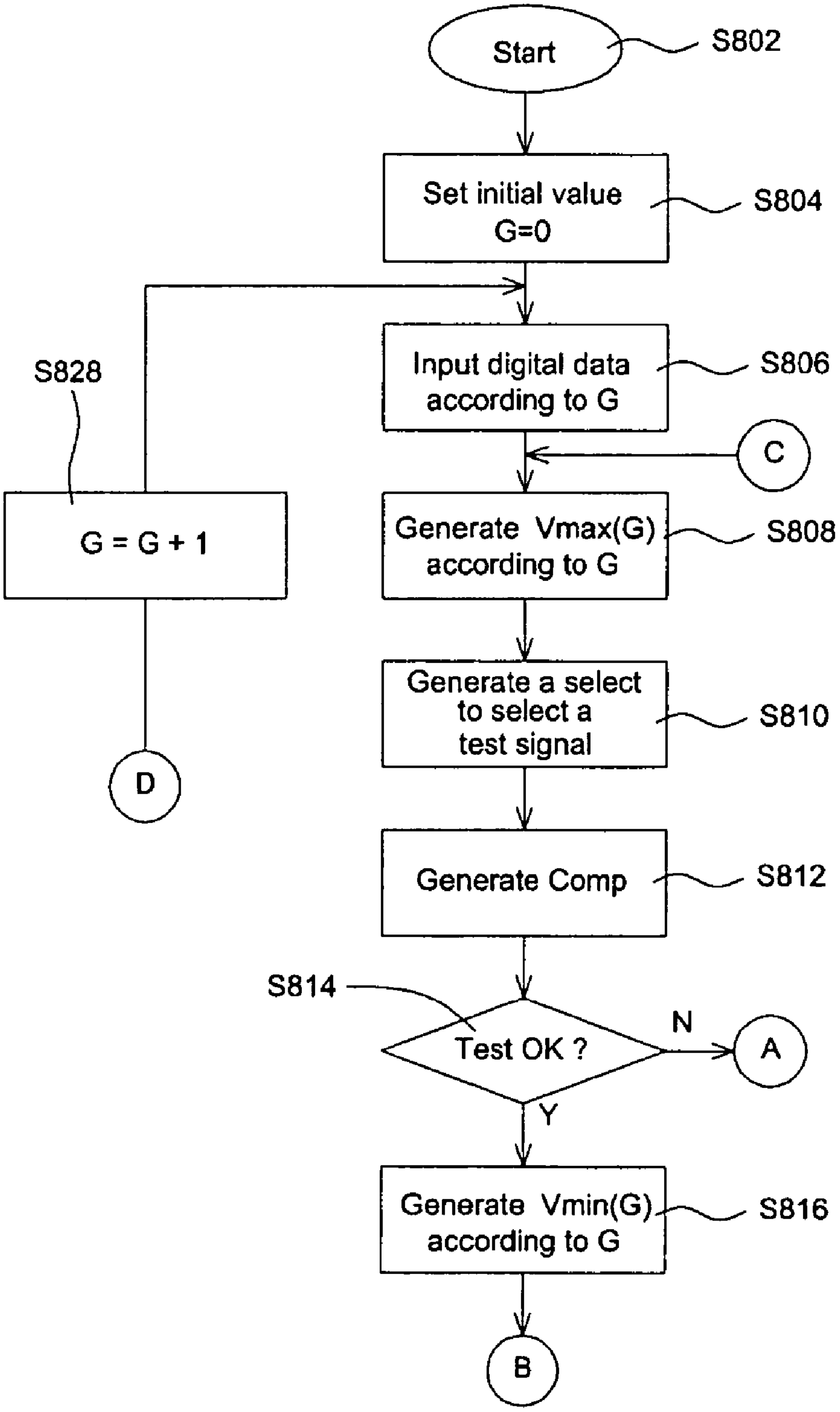
FIGS. 8A and 8B show a flow diagram illustrating a test method with the use of the test unit shown in FIG. 7.
Figure 8B:
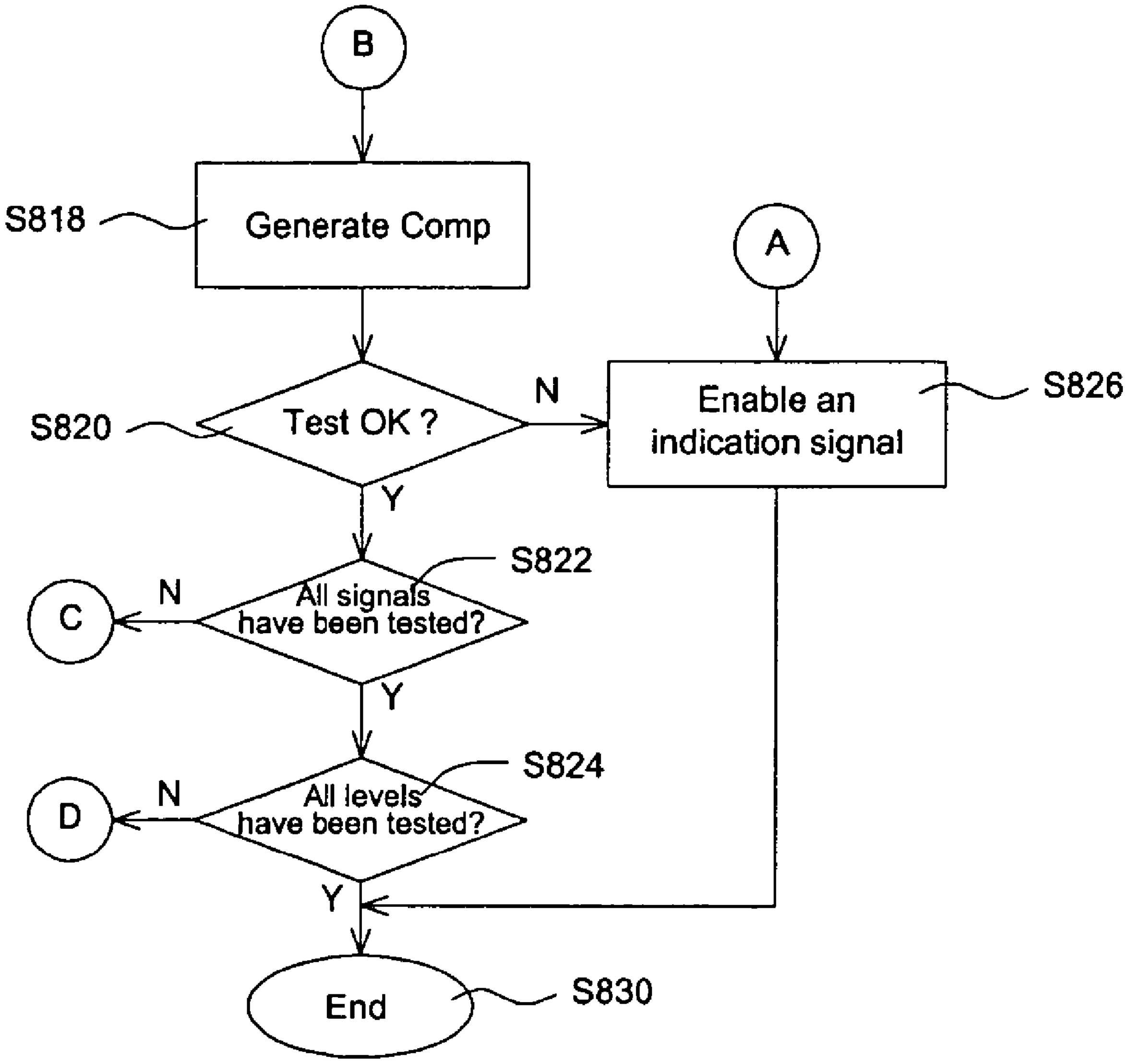

FIGS. 8A and 8B show a flow diagram illustrating a test method with the use of the test unit 71 shown in FIG. 7. The source driver receives N digital data and generates output analog signals S(1)–S(N). The test method includes the following steps:

Step S802: start.

Step S804: set an initial gray-level value G=0. The resolution of the gray-level value is determined by the bit number of the digital data. For instance, the gray-level value equals 0–1023 for 10-bit digital data.

Step S806: input digital data corresponding to the gray-level value G to all driving units 11.

Step S808: generate a high reference voltage Vmax(G) corresponding to the gray-level value G. The high reference voltage Vmax(G) may be produced by the tester 33.

Step S810: generate a select signal for selecting one analog output signal as a test signal. The select signal may be generated by the tester 33.

Step S812: compare the voltage of the test signal with the high reference voltages Vmax(G).

Step S814: if the voltage of the test signal is higher than the high reference voltage Vmax(G), meaning that the driving unit corresponding to that test signal is defective, skip to step S826.

Step S816: generate a low reference voltage Vmin(G) corresponding to the gray-level value G. The low reference voltage Vmin(G) may be generated by the tester 33.

Step S818: compare the voltage of the test signal with the low reference voltage Vmin(G).

Step S820: if the voltage of the test signal is lower than the low reference voltage Vmin(G), meaning that the driving unit corresponding to that test signal is defective, skip to step S826.

Step S822: detect whether all the analog input signals have been tested. If no, go back to step S808.

Step S824: detect whether all the gray-level values have been tested. If no, skip to step S826. If yes, skip to step S830.

Step S826: adjust the gray-level value and go back to step S806. For example, the gray-level value G may be added with one unit at a time.

Step S828: enable an indication signal indicating the defective state of the driving unit.

Step S830: end.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. For instance, the multiple judging units may be divided into different groups, such as every eight units being included into one group. The output wires of the judging units in the same group are connected together first, and then the aggregate of wires is connected to a pin with or without logic operations to reduce the number of total pins. Therefore, the scope of the appended claims should be accorded the broadest interpretation so as to encompass all such modifications and similar arrangements.

What is claimed is:

1. A TFT-LCD source driver with a built-in test circuit, comprising:

a plurality of driving units each receiving digital data and generating an analog output signal according to the digital data; and a plurality of test units, each of which receives at least one of the analog output signals, selects one of them as a test signal according to a select signal, and compares the test signal with a high reference voltage and a low reference voltage to output an indication signal;

wherein the indication signal is set to indicate a normal state as the voltage of the test signal is lower than the high reference voltage and higher than the low reference voltage, while the indication signal is set to indicate an abnormal state as the voltage of the test signal is higher than the high reference voltage or lower than the low reference voltage.

2. The TFT-LCD source driver as recited in claim 1, wherein the test unit comprises:

a multiplexer for receiving at least one of the analog output signals and selecting one of them as a test signal according to the select signal;

a first comparator for receiving the test signal and a first reference voltage signal and comparing their voltage values with each other to generate a first comparison signal;

a second comparator for receiving the test signal and a second reference voltage signal and comparing their voltage values with each other to generate a second comparison signal; and a judging unit for receiving the first and second comparison signals to generate the indication signal.

3. The TFT-LCD source driver as recited in claim 2, wherein the numbers of the P test units, M analog output signals received by the multiplexer, and N driving units must satisfy the condition P×M>=N.

4. The TFT-LCD source driver as recited in claim 2, wherein the voltage of the first reference voltage signal is higher than that of the second reference voltage signal.

5. The TFT-LCD source driver as recited in claim 4, wherein the first comparison signal is "L" when the voltage of the test signal is higher than that of the first reference voltage signal, and the second comparison signal is "H" when the voltage of the test signal is lower than that of the second reference voltage signal.

6. The TFT-LCD source driver as recited in claim 5, wherein the judging unit comprises:

a NOT gate for receiving the first comparison signal; and a NAND gate for receiving the output of the NOT gate and the second comparison signal to generate the indication signal.

7. The TFT-LCD source driver as recited in claim 2, wherein the judging unit comprises:

a first NOT gate for receiving the second comparison signal;

a NOR gate for receiving the output of the first NOT gate and the first comparison signal; and a second NOT gate For receiving the output of the NOR gate and generating the indication signal.

8. The TFT-LCD source driver as recited in claim 1, wherein the test unit comprises:

a multiplexer for receiving a plurality of the analog output signals and selecting one of them as a test signal according to the select signal;

a comparator for receiving the test signal and a reference voltage signal and outputting a comparison signal; and a judging unit for receiving the comparison signal and generating the indication signal according the status of the comparison signal;

wherein, when the voltage of the reference voltage signal is the high reference voltage, the indication signal indicates an abnormal state as the voltage of the test signal is higher than that of the reference voltage signal, and, when the voltage of the reference voltage signal is the low reference voltage, the indication signal indicates an abnormal state as the voltage of the test signal is lower than that of the reference voltage signal.

9. The TFT-LCD source driver as recited in claim 8, wherein the numbers of the P test units, M analog output signals received by the multiplexer, and N driving units must satisfy the condition P×M>=N.

* * * * *